United States Patent
Lee et al.

(10) Patent No.: US 6,794,899 B2
(45) Date of Patent: Sep. 21, 2004

(54) ON CHIP METHOD AND APPARATUS FOR TRANSMISSION OF MULTIPLE BITS USING QUANTIZED VOLTAGE LEVELS

(75) Inventors: Hyun Lee, Ladera Ranch, CA (US); Trevor Edward Little, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/235,981

(22) Filed: Sep. 4, 2002

(65) Prior Publication Data

US 2003/0011400 A1 Jan. 16, 2003

Related U.S. Application Data

(63) Continuation of application No. 09/785,592, filed on Feb. 16, 2001, now abandoned.

(51) Int. Cl.[7] .............................................. H03K 19/00
(52) U.S. Cl. .............................. 326/59; 326/83; 326/82; 326/21
(58) Field of Search ............................. 326/59, 60, 82, 326/83, 21; 327/74, 93

(56) References Cited

U.S. PATENT DOCUMENTS

| | | | |
|---|---|---|---|
| 5,194,766 A | 3/1993 | Sugawara | 307/473 |
| 5,973,535 A | 10/1999 | Shibata et al. | 327/333 |
| 6,140,841 A | 10/2000 | Suh | 326/60 |
| 6,160,437 A | 12/2000 | Kim et al. | 327/408 |
| 6,300,795 B1 | 10/2001 | Kirsch et al. | 326/60 |

OTHER PUBLICATIONS

Millman et al. Microelectronics, McGraw Hill, p. 145, 1987.*

* cited by examiner

*Primary Examiner*—Don Le (57) ABSTRACT

Multiple level logic bus drivers and receivers communicate over a bus using a multiple-level logic protocol that transfers multiple bits on each signal wire of a bus in a given interval without increasing the bus width or power dissipation. In one embodiment, four logic levels are employed using CMOS transistor circuitry operating with low voltage (e.g., 1.2V or 1.3V) power supplies ($V_{dd}$) and P and N transistor threshold voltage levels of $V_{tp}$ and $V_{tn}$ on the order of 0.4—0.5V. Thus, the separation between the following four logic levels is approximately uniform: $V_{dd}$; $V_{dd}-V_{tp}$; $V_{ss}+V_{tn}$; and $V_{ss}$. The approximately equal voltage gaps between each quantization level provide uniform noise margins for all levels. A bus noise minimization scheme and a quick recovery scheme ensure the correct data transfer in the presence of injected noise. An initial over drive feature is disclosed for shorter transition times.

12 Claims, 7 Drawing Sheets

| SYMBOLIC VOLTAGE LEVEL | ABSOLUTE VOLTAGE LEVEL | BINARY BIT ALLOCATION | QUAD LEVEL STATE | DECIMAL VALUE |
|---|---|---|---|---|
| $V_{dd}$ | 1.2V | 11 | 1 | 3 |
| $V_{dd}-V_{tp}$ | .8V | 10 | $\beta$ | 2 |
| $V_{ss}-V_{tn}$ | .4V | 01 | $\alpha$ | 1 |
| $V_{ss}$ | 0V | 00 | 0 | 0 |

ON CHIP METHOD AND APPARATUS FOR TRANSMISSION OF MULTIPLE BITS USING QUANTIZED VOLTAGE LEVELS

CROSS-REFERENCE TO RELATED APPLICATIONS

The present application is a continuation application of U.S. patent application Ser. No. 09/785,592 filed on Feb. 16, 2001, now abandoned. The present invention is related to U.S. patent application Ser. No. 09/785,604, entitled "Method and Apparatus for Distributing a Self-Synchronized Clock to Nodes on a Chip," U.S. patent application Ser. No. 09/788,582, entitled "Method and Apparatus for Transferring Multi-Source/Multi-Sink Control Signals Using a Differential Signaling Technique," U.S. patent application Ser. No. 09/785,602, entitled "Method and Apparatus for Distributing Multi-Source/Multi-Sink Control Signals Among Nodes on a Chip," and U.S. patent application Ser. No. 09/789,653, entitled "Bidirectional Bus Repeater for Communications on a Chip," each filed Feb. 16, 2001, assigned to the assignee of the present invention and incorporated by reference herein.

FIELD OF THE INVENTION

The present invention relates generally to communications on a single chip, and more particularly, to a technique for transmitting multiple-level signals on each wire of the single chip.

BACKGROUND OF THE INVENTION

Address and data busses provide data paths that are shared by a number of data processing devices, such as memory devices, micro-controllers, microprocessors, digital signal processors (DSPs) and peripheral devices. Busses are typically formed on printed circuit boards (PCBs) and interconnect the various devices mounted on the PCB. The busses may also extend to connectors in order to allow external devices to be coupled to the bus.

Recently, integrated circuit (IC) manufacturers have begun producing single chips containing multiple device cores, such as multiple memory devices, micro-controllers, microprocessors and digital signal processors, that were traditionally mounted on a PCB and interconnected by one or more busses on the PCB. Such a single chip is commonly referred to as a system-on-a-chip (SoC). SoCs incorporate one or more busses to provide data paths to interconnect the multiple core devices on the chip, often referred to as "nodes." The busses on SoCs, however, comprise conductor traces on the chip and thus tend to be much shorter in length than PCB busses.

As SoCs grow in size and complexity, the requirement of communicating control and data signals between various nodes or devices on the SoC becomes more difficult, primarily due to the resistive-capacitive (RC) delays attributed to the conductor length. To meet customer expectations for increasing performance, DSP and microprocessor architects are adopting wider buses for address and data signals used to communicate with memory and peripheral devices. Consequently, the area and power required for these buses to operate can become a very significant portion of the total device size (cost) and power budget.

A need therefore exists for a method and apparatus for transmitting additional data on a chip without increasing the bus width or power dissipation. A number of techniques have been proposed or suggested in the data transmission domain for improving transmission performance. Computer modem devices operating in the 1200 to 9600 bits-per-second (baud) range, for example, convert short strings of digital bits into phase or amplitude modulated sinusoidal carrier signals (or both). Thus, multiple bits may be converted to quadrature phase-shift modulation of various frequency sinusoids and the carrier signal may be transmitted long distances without losing its information content. While this technique performs well for long distance transmissions, it is not well suited to on-chip environment of the present invention. Specifically, the length of the wire trace is shorter than the required wavelength and the signal cannot modulate.

10BASE-T Ethernet systems use a bit-serial transmission scheme over twisted pairs to transmit data over distances on the order of 100 meters. The data is represented by current transitions that are coupled on-to and off-of the line through transformers. Within one bit interval, the data value is represented as either one transition or two transitions. For example, a high-to-low transition might represent the value zero (0), while a low-to-high-to-low transition pair might represent the value one (1). The guaranteed presence of transitions makes clock recovery possible and hence provides reliable data recovery. While this technique performs well for transmissions of reasonably long length, it is not well-suited to on-chip environment of the present invention. Specifically, the inductive coupling of signals onto the transmission line associated with the 10BASE-T Ethernet standard would be difficult to achieve in normal CMOS processing.

Discrete voltage levels have been used to store information. One example of a multi-level storage system is a 2 bits-per-cell dynamic random access memory (DRAM) from Toshiba, as described in Betty Prince, "Semiconductor Memories," 334 (1989). Each cell stores one of four voltage (charge) levels to record two bits of information. The output of the cell is compared in parallel with three reference levels positioned at the mid-range points to determine the stored value. A second example of a multi-level charge storage system is the StrataFlash non-volatile memory technology from Intel Corp. The StrataFlash memory also stores 2 bits-per-cell using four voltage (charge) levels.

These existing multi-level memory devices demonstrate that CMOS circuits can be built to reliably detect at least four voltage levels. Both memories use reference voltages and sense amplifiers to discriminate voltage levels that are proportional to the stored charge. In a memory, each sense amplifier is shared by many storage cells, and the number of outputs is relatively small, on the order of 1 or 4 outputs for a DRAM and 8 or 16 outputs for a Flash electronically erasable programmable read only memory (EEPROM). For a SoC bus application, however, the bus may be 128 or more bits wide, and each receiving module would need a set of sense amplifiers. Hence, linear sense amplifiers may not be practical for a bus application because of the high active power dissipation.

SUMMARY OF THE INVENTION

Generally, a method and apparatus are disclosed for transmitting multiple bits among nodes on a chip using quantized voltage levels. Each node on the chip includes a multiple level logic bus driver and receiver for communicating over a bus using a multiple-level logic protocol in accordance with the present invention. The multiple-level logic protocol transfers multiple bits on each signal wire of the bus in a given time interval without increasing the bus width or power dissipation.

In an exemplary embodiment, four logic levels are employed using CMOS transistor circuitry operating with low voltage (e.g., 1.2V or 1.3V) power supplies ($V_{dd}$) and P and N transistor threshold voltage levels of $V_{tp}$ and $V_{tn}$ on the order of 0.4–0.5V. Thus, the separation between each voltage level is approximately uniform. The exemplary quad logic level quantization divides the supply voltage level into approximately 3 equal parts such that the gap between each logic level becomes 0.4V to 0.5V in the exemplary embodiment. Thus, four logic levels are established as follows: $V_{dd}$; $V_{dd}-V_{tp}$; $V_{ss}+V_{tn}$; and $V_{ss}$.

The lower supply voltages employed by the present invention provide two inherent advantages, compared to a higher power supply (over 2V). First, the approximately equal voltage gaps between each quantization level provide uniform noise margins for all levels. Second, since the absolute magnitude of the coupling noise is much lower, it requires less active power to recover from an AC injected noise source. In addition, the number of physical wires on the bus can be reduced by at least half for the same number of bits transferred. The present invention also reduces the total transmission power by more than fifty percent (50%) since some of the signal transitions are less than rail-to-rail.

A bus noise minimization scheme and a quick recovery scheme are also disclosed to ensure the correct data transfer in the presence of injected noise. The disclosed quad logic level bus driver includes a high impedance equalizer transistor that serves as a noise minimizer and allows quick recovery from an injected noise transient. Another aspect of the invention, provides an initial over drive for shorter transition times. One characteristic of transistor circuits employing low power supply voltages (i.e., $V_{dd}$ approximately equal to $3V_t$) is that the voltage level of logic α and β states are very close to the N and P transistor threshold voltage levels ($V_{tn}$ and $V_{dd}-V_{tp}$, respectively). Thus, when logic a is driven on a bus wire, the receiver would not be able to quickly distinguish the a logic level from logic '0' ($V_{SS}$). Therefore, to overcome this problem and to ensure quick data transfer, the circuit portion of this invention includes a data over driver circuit within the bus driver such that, when the data on the bus changes from 1 or 0 to either α or β the over drive circuit becomes active and drives the bus wire with $V_{ss}+V_{tn}$ (or $V_{dd}-V_{tp}$).

A more complete understanding of the present invention, as well as further features and advantages of the present invention, will be obtained by reference to the following detailed description and drawings.

DETAILED DESCRIPTION

Figure 1:
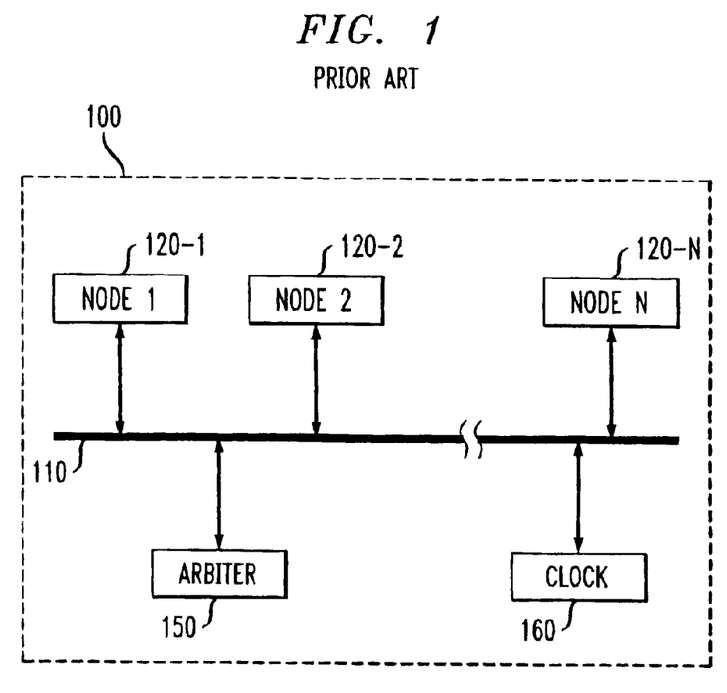
FIG. 1 is a schematic block diagram illustrating a conventional SoC where the present invention can operate.

FIG. 1 is a schematic block diagram illustrating an exemplary SoC 100 where the present invention can operate. The exemplary SoC 100 includes a bus 110 that interconnects various nodes 120-1 through 120-N (multiple core devices), collectively referred to as nodes 120, on the chip 100. The nodes 120 may be embodied, for example, as memory devices, micro-controllers, microprocessors and digital signal processors. When an SoC 100 includes multiple nodes 120 communicating over a common bus 110, an Arbiter 150 is often used to determine which node 120 should actively drive the bus 110 at a particular time. Multi-source/multi-sink control signals, such as acknowledgement (ACK), data-valid, interrupt and error signals, are often employed to control communications on the SoC bus 110. All of the various nodes 120 and the Arbiter 150 typically operate synchronously with respect to a common clock 160.

Figure 2:
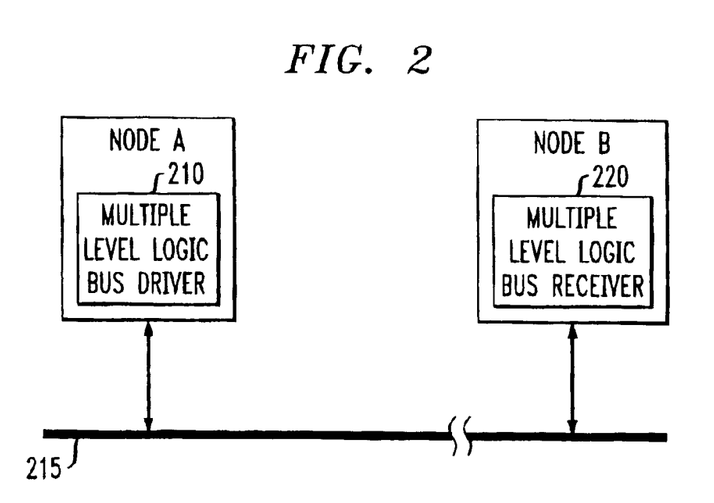
FIG. 2 illustrates a multiple level logic bus driver and receiver communicating over a common bus in accordance with the present invention.

FIG. 2 illustrates a multiple level logic bus driver 210 associated with a first node A and a multiple level logic bus receiver 220 associated with a node B communicating over the common bus 110 of FIG. 1 in accordance with the present invention. The logic bus driver 210 and logic bus receiver 220 employ a multiple-level logic protocol to transfer multiple bits on each signal wire of the bus 215 in a given interval without increasing the bus width or power dissipation. While the present invention is illustrated herein in an exemplary SoC environment, the present invention is applicable to any environment where bits are transmitted from one device to another over a common bus line. Exemplary quad logic implementations of the logic bus driver 210 are discussed further below in conjunction with FIGS. 4 through 6 and exemplary quad logic implementations of the logic bus receiver 220 are discussed further below in conjunction with FIGS. 7 and 8.

Figure 3:
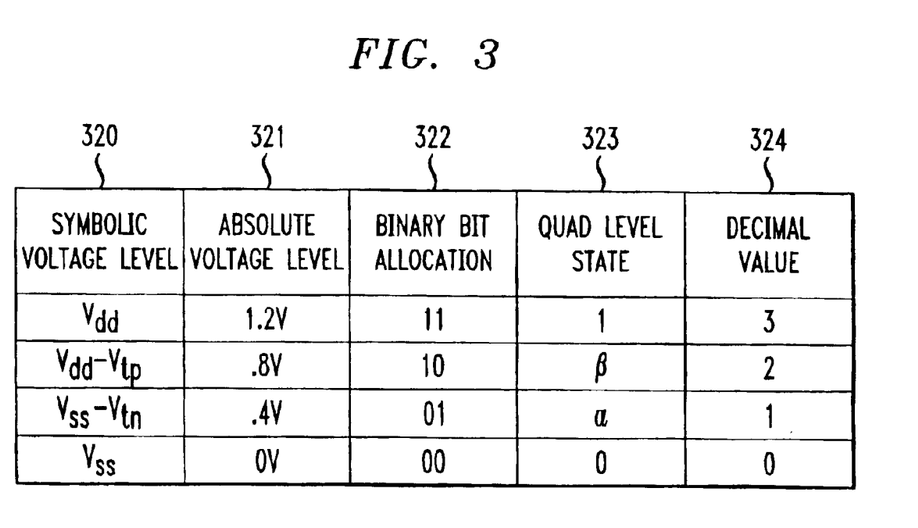
FIG. 3 is a table illustrating the assignment of various voltage levels to corresponding binary values in a quad logic level embodiment of the present invention.

In the exemplary embodiment of the present invention, four logic levels are employed using CMOS transistor circuitry operating with 1.2V or 1.3V power supplies ($V_{dd}$) and P and N transistor threshold voltage levels of $V_{tp}$ and $V_{tn}$ on the order of 0.4–0.5V. Among other benefits, such CMOS transistors are selected due to the uniformity of the voltage level separation. The exemplary quad logic level quantization divides the supply voltage level into approximately 3 equal parts such that the gap between each logic level becomes 0.4V to 0.5V. As shown in FIG. 3, each logic level is then approximately defined as follows: $V_{dd}$ (1.2V–1.3V); $V_{dd}-V_{tp}$ (0.8V); $V_{ss}+V_{tn}$ (0.4V); and $V_{ss}$ (0V). An exemplary binary, symbolic and decimal bit allocation for each level is shown in fields 322–324 of FIG. 3. Of course, variations on the precise voltage levels and corresponding binary assignments shown in FIG. 3 are possible, as would be apparent to a person of ordinary skill in the art.

The lower supply voltage employed by the present invention provides two inherent advantages, compared to a higher power supply (over 2V). First, as indicated above, since the voltage gaps between each quantization level are approximately equal, the noise margins for all levels are the same.

Thus, it is easier to design the noise recovery/immunity circuit and the circuitry is not biased towards any particular level. Second, since the absolute magnitude of the coupling noise is much lower, it requires less active power to recover from an AC injected noise source.

As previously indicated, four logic levels on a bus wire permits two bits of data to be transmitted on a single wire in each interval. Therefore, the number of physical wires on the bus 215 can be reduced in half for the same number of bits. It has also been observed that the reduction in total transition power is more than fifty percent (50%) because some of the signal transitions are less than rail-to-rail.

The voltage gap between any two logic levels is one third of the voltage gap of the two logic levels of bi-level logic. Thus, to ensure the correct data transfer, it is important to implement a bus noise minimization scheme and a quick recovery scheme from any injected noise. According to one feature of the invention discussed below in conjunction with FIGS. 4–6, the circuit implementation of the quad logic level bus driver includes a high impedance equalizer transistor that serves as a noise minimizer and allows quick recovery from an injected noise transient. The disclosed noise recovery mechanism circuit tolerates rail-to-rail noise (1.2V in the exemplary embodiment).

Another feature of the present invention, discussed further below, provides an initial over drive for a shorter transition time. One characteristic of transistor circuits employing low power supply voltage ($V_{dd}$ approximately equal to $3V_t$) is that the voltage level of logic α and β states are very close to the N and P transistor threshold voltage levels ($V_{tn}$ and $V_{dd}-V_{tp}$, respectively). Thus, when logic α is driven on a bus wire, the receiver would not be able to quickly distinguish the a logic level from logic '0' ($V_{ss}$). Therefore, to overcome this problem and to ensure quick data transfer, the circuit portion of this invention includes a data over driver circuit within the bus driver such that, when the data on the bus changes from 1 or 0 to either α or β, the over drive circuit becomes active and drives the bus wire with $V_{ss}+V_{tn}$ (or $V_{dd}-V_{tp}$).

Quad Logic Level Bus Driver (QLLBD)

Figure 4:
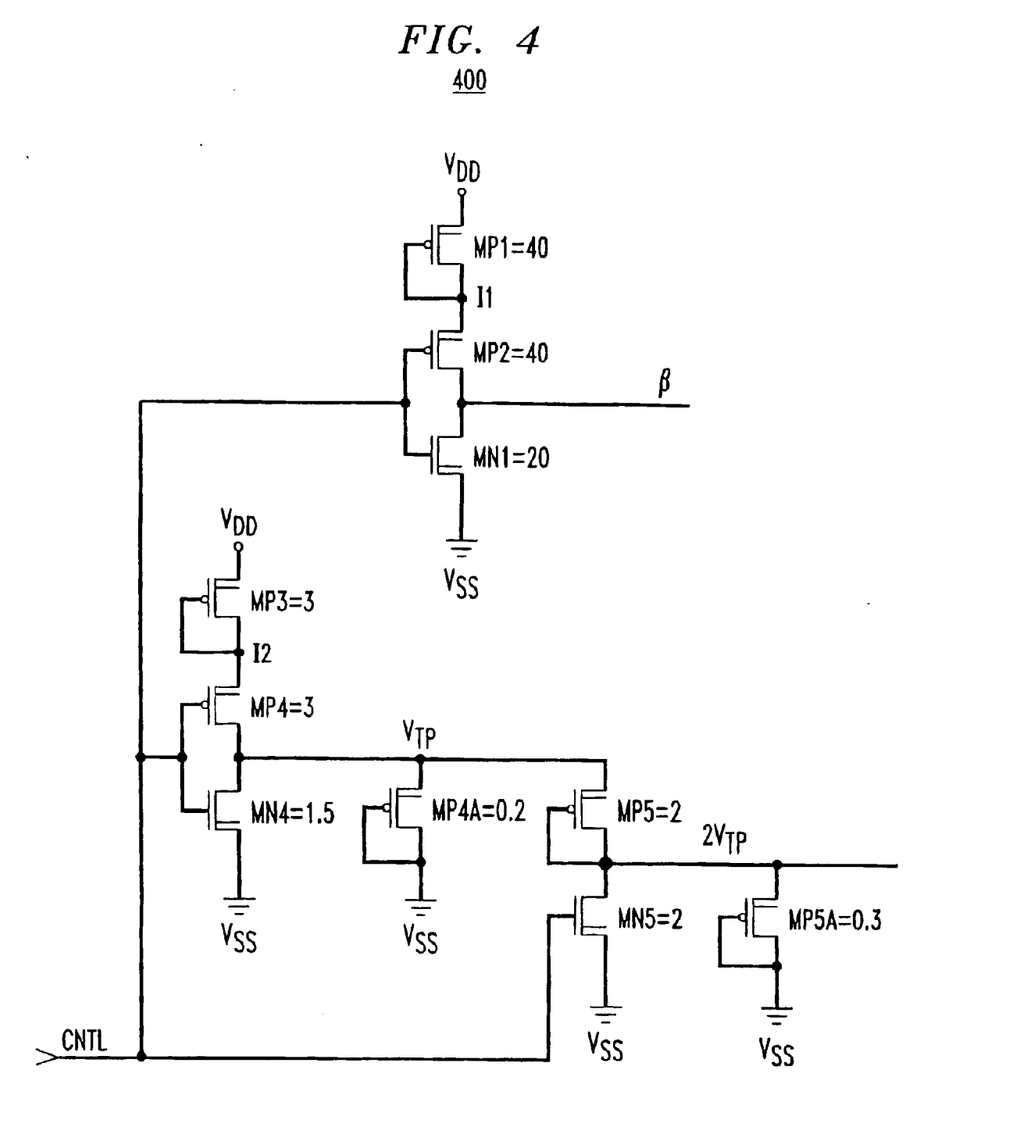
FIG. 4 is a circuit diagram illustrating an exemplary digital circuit implementation of a logic level β generator in accordance with the present invention.
Figure 5:
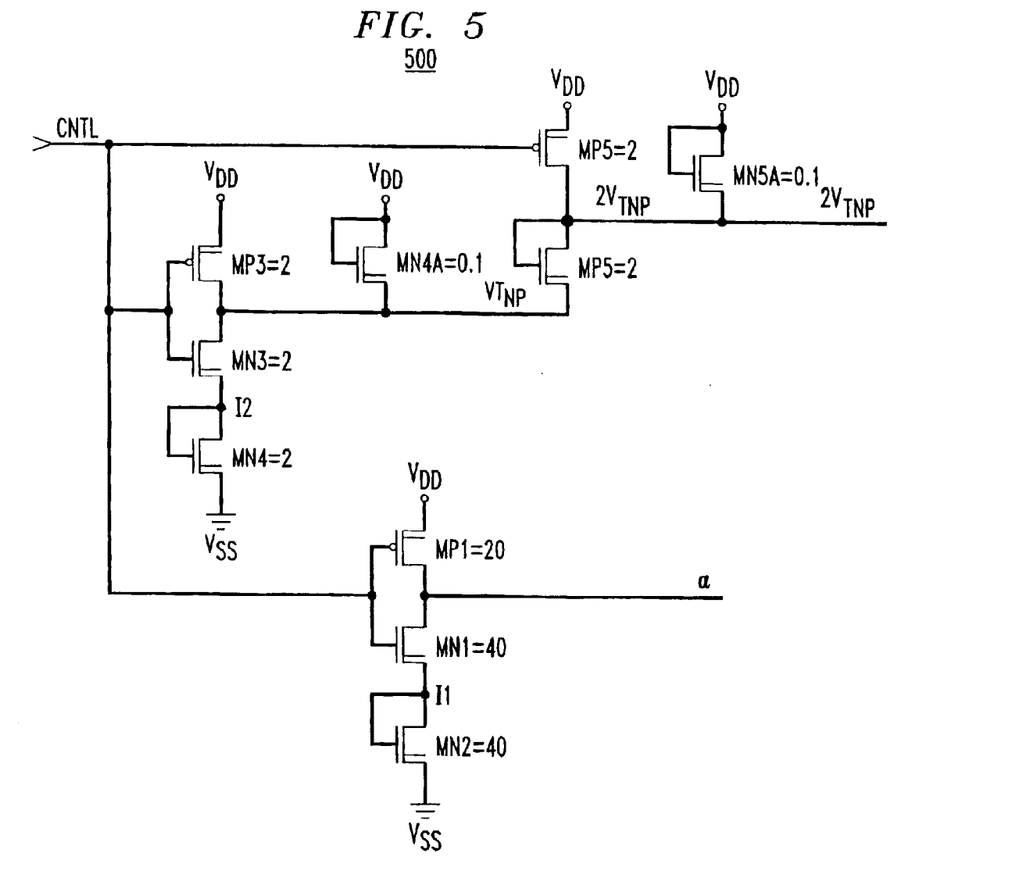
FIG. 5 is a circuit diagram illustrating an exemplary digital circuit implementation of a logic level α generator in accordance with the present invention.
Figure 6:
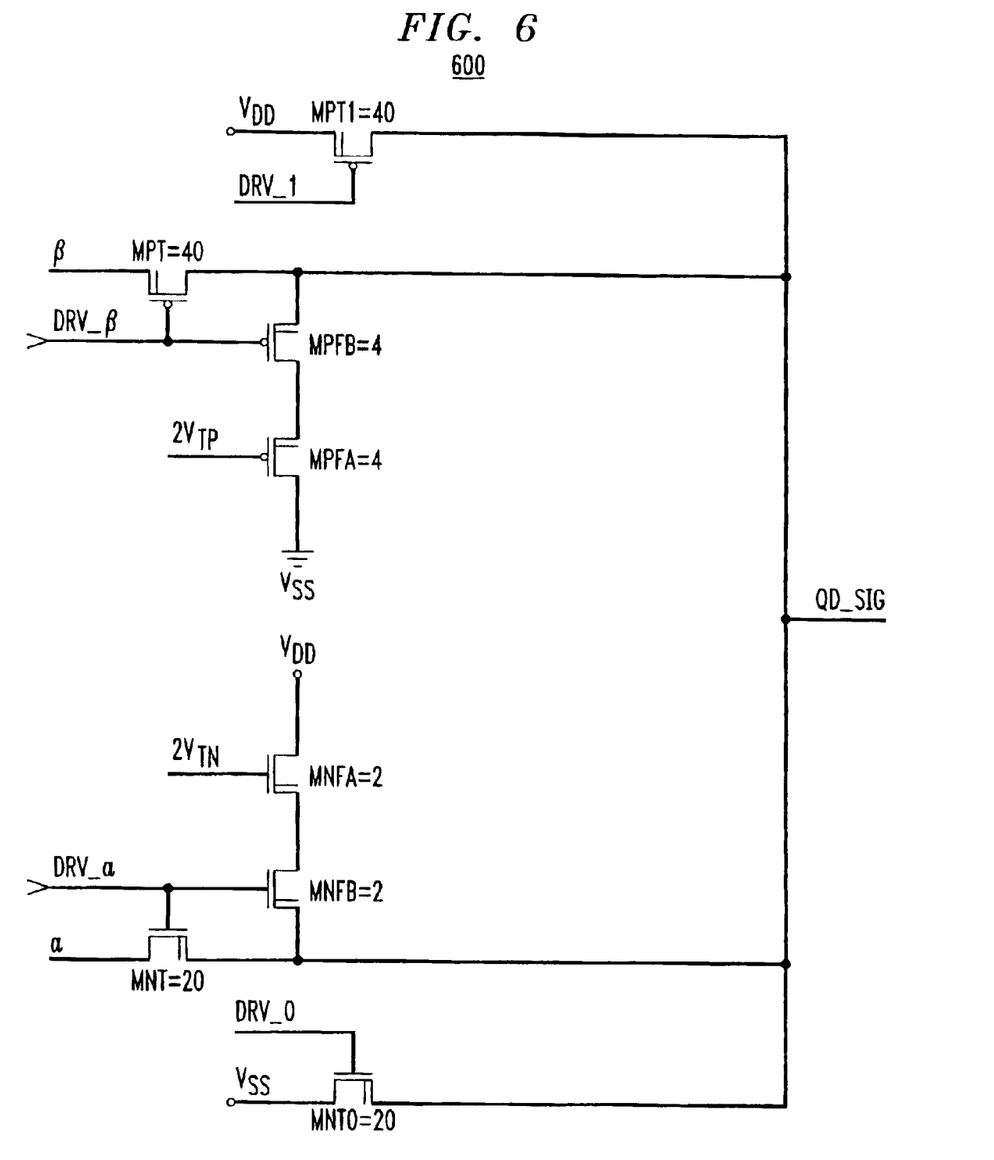
FIG. 6 is a circuit diagram illustrating an exemplary digital circuit implementation of a quad logic level bus driver in accordance with the present invention.

FIGS. 4 through 6 illustrate a way of realizing the Quad Logic Level Bus Driver with COM2 digital circuits. The normalized transistor sizes are given with the type of transistors in each figure for an exemplary implementation. FIG. 4 is a circuit diagram illustrating an exemplary digital circuit implementation of a logic level β generator 400. The control signal, CNTL, shown in FIG. 4 only becomes active ($V_{SS}$) when a node 120 needs to drive the SoC bus 110 (FIG. 1). When CNTL is inactive, the PMOS transistors, MP2 and MP4, are shut off and the output nodes, β, and $2V_{TP}$, are pulled down to $V_{SS}$. Thus, it eliminates any DC power consumption. Likewise, when CNTL is active, the output node β is driven to $V_{DD}-V_{tp}$, and the node $2V_{TP}$ is driven to $V_{DD}-2V_{tp}$, where $V_{tp}$ is the specified PMOS threshold voltage. The bus line driver consists of transistors MP1, MP2 and MN1, and the transistors, MP3–MP5 and MN4–MN5, serve as the bus noise recovery transistors. The transistors MP4A and MP5 are configured as very weak diodes that are used to discharge any charge built up due to noise injection on these nodes. The output node $2V_{TP}$ is used to recover the bus signal from any cross talk noise injected on the bus wire. A detailed description of the bus noise recovery mechanism is given in a section entitled "Noise Recovery Mechanism."

FIG. 5 is a circuit diagram illustrating an exemplary digital circuit implementation of a logic level α generator 500. The operation of this circuit is almost identical to the operation of the logic level β generator 400, discussed above. In this case, the active level of the control signal, CNTL, is $V_{DD}$. Thus, unless the node 120 needs to drive the bus 110, CNTL is driven with $V_{SS}$, and the NMOS transistors (MN1 and MN3) are shut off to eliminate any DC power consumption. Again, just as for the logic level β generator 400, the transistors, MP3-MP5 and MN4–MN5A, serve as the bus noise recovery transistors.

FIG. 6 is a circuit diagram illustrating an exemplary digital circuit implementation of the quad logic level bus driver 600. The transistors MPT1, MPT, MNT and MNT0 are configured as a multiplexer with inputs tied to four logic levels. The active level of the control signals DRV_1 and DRV_β is low ($V_{SS}$), and the active level of DRV_α and DRV_0 is high ($V_{DD}$). The output of this driver (QD_SIG) represents the encoded value of a two bit binary number such that binary 00 is represented by the logic level 0, 01 is represented by α, 10 by β and binary 11 by the logic level 1.

Bus Over-Drive

An important criteria for designing a multiple logic level bus is that each logic level is well distinguished by any receiver 220 connected to the bus 110. This criteria is not easy to satisfy when the operating voltage is equal to $3V_t$. As previously indicated, when the power supply voltage is $3V_t$, the quad logic levels are quantized nicely into four levels with equal separation amongst them. However, the voltage level of each logic state is not well recognized by the receiver. For example, the voltage level of logic level α is $V_{tn}$, the NMOS threshold voltage. This voltage level can turn on the NMOS transistors in the receivers 220, but the 'ON' state is weak and it would produce a very slow signal transition on the outputs of the receiver. Thus, the data transfer rate suffers and the power dissipation increases.

Thus, the present invention incorporates a bus over-driving mechanism in the logic level generators 400, 500 and QLLBD 600 to enhance the data transfer rate and to minimize the transient (switch) power. An operational example of the bus over-driving mechanism is discussed herein for the case when a bus wire is driven with β. Referring to FIGS. 4 through 6, there are three time intervals ($T_0-$, $T_0+$ and $T_0++$) relevant to the over-driving mechanism:

$T_0-$. The bus 110 is not yet driven by the node 120-i— CNTL and DRV_β are inactive ($V_{DD}$), node β is low ($V_{SS}$), node $2V_{TP}$ is low ($V_{SS}$). Thus, the transistors MPT and MPFB are off, and the transistor MPFA is on.

$T_0+$. The node 120-i just starts to drive the bus 110— CNTL and DRV_β become active ($V_{SS}$), but node β and node $2V_{TP}$ are still low ($V_{SS}$), the transistors MPT and MPFB turn on first before the transistor MPFA shut off.

Thus, a direct DC path is created to ground from the bus wire (QD_SIG) via MPFB-MPFA (FIG. 6), and discharges the bus wire which causes a down swing of the bus voltage level to a value below the logic level β. The amount of down swing is controlled by properly sizing the transistors, and the bus is over driven by the voltage difference between the down swing level and the logic β level. The exemplary over-drive is approximately 0.15V for the α driver and 0.18V for the β driver.

$T_0++$. The module drives the bus wire with the logic level β—MPFA shuts off and the bus wire (QD-SIG) in FIG. 6 is driven to the logic level β by transistors MP1 and MP2 (FIG. 4).

The operation of the bus over driving mechanism for driving the bus 110 with the logic level α is very similar to the case described at above for the β level.

Noise Recovery Mechanism

Consider the case when the signal level on the wire QD_SIG is β. In this case, if a noise injection into the wire causes the wire voltage to swing downward, the driver transistor MP1, MP2 (FIG. 4) and MPT (FIG. 6) can pull up the voltage on the wire back to the logic level β. However, if the injected noise causes the voltage to move upward, the logic level on the wire can not be recovered unless there is a mechanism to discharge the injected charge due to noise. For this purpose, a noise recovery mechanism is implemented in the Logic Level β generator 400 and the bus driver 600. The noise recovery mechanism consists of a group of transistors to produce a stable noise recovery reference voltage ($2V_{TP}$) for the QLLBD 600 (FIG. 6). The node $2V_{TP}$ (FIG. 4) is connected to the transistor MPFA (FIG. 6) such that whenever crosstalk noise couples into QD_SIG and raises the QD_SIG voltage level above β, MPFA turns on to discharge the wire back to the logic β level.

The operation of the noise recovery mechanism while driving α (on QD_SIG) is very similar with the case described above for the β level. In the α case, whenever the voltage on QD_SIG swings downward below the voltage level of α, MNFA turns on and charges the wire QD_SIG back to the logic level α. It has been observed that when the injected noise causes the two bus wires to swing all the way to VDD and $V_{SS}$, the noise recovery circuit of the present invention ensures that the bus wires quickly recover from the effect of any cross coupled noise.

Quad Logic Level Bus Receiver (QLLBR)

Figure 7:
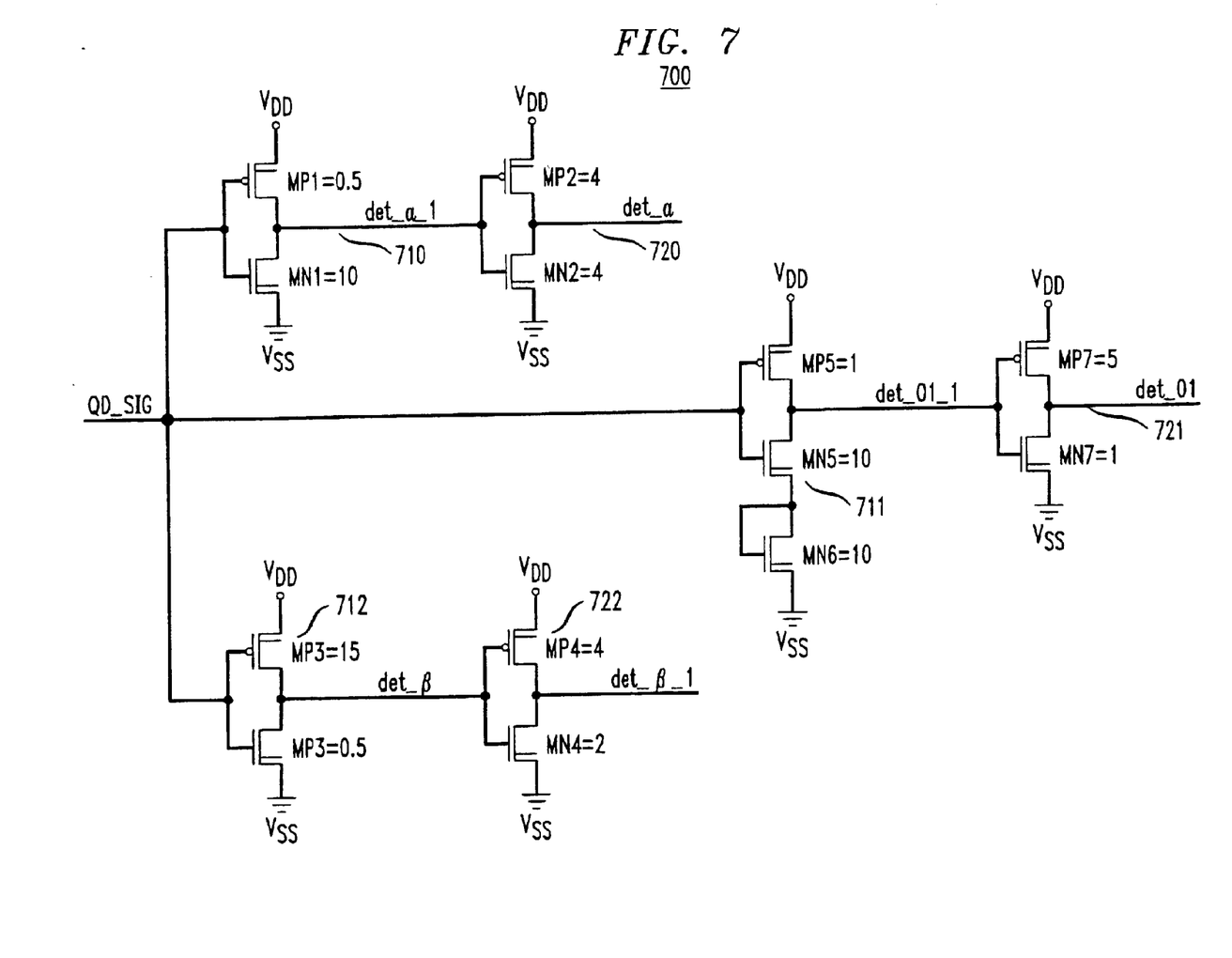
FIG. 7 is a circuit diagram illustrating an exemplary digital circuit implementation of a quad logic level detector used in a quad logic level bus receiver in accordance with the present invention.
Figure 8:
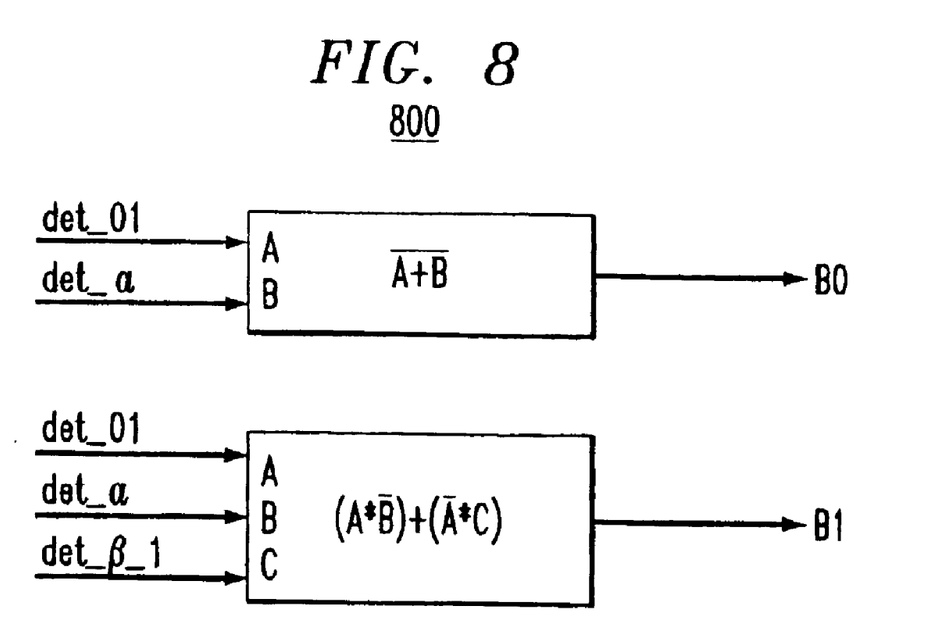
FIG. 8 is a circuit diagram illustrating an exemplary digital circuit implementation of a quad logic level decoder used in a quad logic level bus receiver in accordance with the present invention.

The quad logic level bus receiver consists of a quad logic level detector (QLLD) 700, discussed below in conjunction with FIG. 7, and a decoder 800, discussed below in conjunction with FIG. 8. As shown in FIG. 7, the QLLD 700 contains six inverters 710-712 and 720-722, with three input inverters 720-722 operating to detect the logic levels on the bus wire QD_SIG, and three inverters 710-712 operating to refine the waveform. The function of THE QLLD 700 is to convert the quad logic level input to binary indication signals such that each detect signal (det_α, β and 01) indicates the presence of a certain logic level at the bus wire QD_SIG. In FIG. 7, the transistor sizes are selected such that each input inverter switch point favors a certain input logic level over the others. For example, the NMOS to PMOS ratio of the input inverter det_α_1 is 20. With this ratio, when the input level is α, although MP1 and MN1 are both on, the output is driven to $V_{SS}$ because the transconductance of MN1 is much greater than the transconductance of MP1. In fact, the output of the det_α_1 inverter only goes (binary) high when the input is (quad logic) 0.

The decoder 800 is implemented with conventional CMOS logic gates that perform the function indicated in FIG. 6. The fully decoded final signals (BO and B1) are shown in FIG. 7.

The present invention reduces the physical size of a SoC bus by at least fifty percent (50%) for the same bandwidth and reduces the power dissipation by at least sixty percent (60%), since a data/address bus connected to a quad logic level driver/receiver 210, 220 requires about ⅓ of the power that would be needed to drive the bus 110 with a conventional driver (bi-logic-levels 1 and 0). In addition, the data over-drive circuit and the noise recovery circuit features of the present invention allow the quad logic level (SoC) bus 110 to be operative for low voltage conditions, such as 1.3 V. Since the invention can be implemented with digital circuitry, it makes it easier to transport the circuit from one technology to another technology. The present invention also provides a standard interface to/from nodes 120, since the input signals to the bus driver 210 and the output signals from the bus receiver 220 are binary (data/address) I/O signals and any existing IP block can be connected to the quad logic level bus as is.

It is to be understood that the embodiments and variations shown and described herein are merely illustrative of the principles of this invention and that various modifications may be implemented by those skilled in the art without departing from the scope and spirit of the invention.

We claim:

1. A chip having a plurality of nodes, said chip comprising:
    a common bus for communications between said nodes;
    a first node having a multiple level logic bus driver that transmits multiple bits on a wire of said bus in a given time interval wherein said multiple levels are achieved in said multiple level logic bus driver using power supply voltages and threshold voltages of transistors on said chip; and
    a second node having a multiple level logic bus receiver that receives said multiple bits on said bus.

2. The chip of claim 1, wherein said multiple levels are substantially uniform.

3. The chip of claim 1, wherein said transistors are low voltage CMOS transistors.

4. The chip of claim 3, wherein said low voltage CMOS transistors utilize a power supply voltage of approximately 1.2V and have threshold voltages of approximately 0.4V.

5. The chip of claim 1, wherein said power supply voltages and threshold voltages provide a uniform level separation of approximately 0.3V.

6. The chip of claim 1, wherein said power supply voltages and threshold voltages establish four logic levels as follows: $V_{dd}$; $V_{dd}-V_{tp}$; $V_{ss}+V_{tn}$; and $V_{ss}$, where $V_{dd}$ is a power supply voltage, $V_{ss}$ is 0V, $V_{tp}$ is a P-transistor threshold voltage level and $V_{tn}$ is an N-transistor threshold voltage level.

7. A method for communicating multiple bits among a plurality of nodes on a chip, said method comprising the steps of:
    establishing a plurality of voltage levels on said chip using power supply voltages and threshold voltages of transistors on said chip; and
    communicating over a bus using a multiple-level logic protocol that is achieved using said power supply voltages and said threshold voltages of said transistors.

8. The method of claim 7, wherein said plurality of voltage levels are substantially uniform.

9. The method of claim 7, wherein said transistors are low voltage CMOS transistors.

10. The method of claim 9, wherein said low voltage CMOS transistors utilize a power supply voltage of approximately 1.2V and have threshold voltages of approximately 0.4V.

11. The method of claim 7, wherein said power supply voltages and threshold voltages provide a uniform level separation of approximately 0.3V.

12. The method of claim 7, wherein said power supply voltages and threshold voltages establish four logic levels as follows: $V_{dd}$; $V_{dd}-V_{tp}$; $V_{ss}+V_{tn}$; and $V_{ss}$, where $V_{dd}$ is a power supply voltage, $V_{ss}$ is 0V, $V_{tp}$ is a P-transistor threshold voltage level and $V_{tn}$ is an N-transistor threshold voltage level.

* * * * *

UNITED STATES PATENT AND TRADEMARK OFFICE
CERTIFICATE OF CORRECTION

PATENT NO. : 6,794,899 B2
DATED : September 21, 2004
INVENTOR(S) : Lee et al.

It is certified that error appears in the above-identified patent and that said Letters Patent is hereby corrected as shown below:

Column 8,
Lines 18-23, replace, "a first node having a multiple level logic bus driver that transmits multiple bits on a wire of said bus in a given time interval wherein said multiple levels are achieved in said multiple level logic bus driver using power supply voltages and threshold voltages of transistors on said chip; and"
with
-- a first node having a multiple level logic bus driver that transmits multiple bits on a wire of said bus in a given time interval wherein at least one of said multiple levels corresponds to one or more threshold voltages of transistors on said chip; and --.
Lines 45-47, replace, "establishing a plurality of voltage levels on said chip using power supply voltages and threshold voltages of transistors on said chip; and"
with
-- establishing a plurality of voltage levels on said chip wherein at least one of said levels corresponds to one or more threshold voltages of transistors on said chip; and --.
Lines 48-50, replace, "communicating over a bus using a multiple-level logic protocol that is achieved using said power supply voltages and said threshold voltages of said transistors."
with
-- communicating over a bus using a multiple-level logic protocol that includes said one or more threshold voltages of said transistors. --.

Signed and Sealed this

Thirtieth Day of August, 2005

JON W. DUDAS
*Director of the United States Patent and Trademark Office*